(12) United States Patent
Yamada

(10) Patent No.: US 7,716,541 B2
(45) Date of Patent: May 11, 2010

(54) TEST APPARATUS AND ELECTRONIC DEVICE FOR GENERATING TEST SIGNAL TO A DEVICE UNDER TEST

(75) Inventor: Tatsuya Yamada, Tokyo (JP)

(73) Assignee: Advantest Corporation, Tokyo (JP)

( * ) Notice: Subject to any disclaimer, the term of this patent is extended or adjusted under 35 U.S.C. 154(b) by 351 days.

(21) Appl. No.: 11/688,879

(22) Filed: Mar. 21, 2007

(65) Prior Publication Data

US 2008/0235548 A1 Sep. 25, 2008

(51) Int. Cl.
  G06F 11/00 (2006.01)
  G11C 29/00 (2006.01)
(52) U.S. Cl. .................................... 714/718
(58) Field of Classification Search ........................ None
  See application file for complete search history.

(56) References Cited

U.S. PATENT DOCUMENTS

| | | | |
|---|---|---|---|
| 5,737,512 A | * | 4/1998 | Proudfoot et al. ............. 714/32 |
| 5,838,694 A | * | 11/1998 | Illes et al. ................... 714/738 |
| 6,009,546 A | * | 12/1999 | Kuglin et al. ............... 714/738 |
| 6,092,225 A | * | 7/2000 | Gruodis et al. .............. 714/724 |

FOREIGN PATENT DOCUMENTS

| | | |
|---|---|---|
| JP | 08-094724 | 4/1996 |
| JP | 09128257 | 5/1997 |
| JP | 10-078476 | 3/1998 |
| JP | 200390863 | 3/2003 |
| WO | WO98/23968 | 6/1998 |
| WO | 2004109307 | 12/2004 |
| WO | WO2004/109307 | 12/2004 |

* cited by examiner

*Primary Examiner*—Christine T Tu
(74) *Attorney, Agent, or Firm*—Jianq Chyun IP Office

(57) ABSTRACT

A test apparatus is provided. The test apparatus includes: a main memory that stores pattern data including at least one pattern bit defining a test signal provided to each of a plurality of terminals of the device under test; a pattern cache memory that caches the pattern data read from the main memory; a pattern generation control section that reads pattern data from the main memory and writes the same to the pattern cache memory; a pattern generating section that sequentially reads the pattern data stored in each cache entry of the pattern cache memory and outputs the same; and a channel circuit that generates a test signal corresponding to each of the plurality of terminals based on the pattern data outputted from the pattern generating section and provides the same to the device under test.

5 Claims, 10 Drawing Sheets

US 7,716,541 B2

TEST APPARATUS AND ELECTRONIC DEVICE FOR GENERATING TEST SIGNAL TO A DEVICE UNDER TEST

BACKGROUND

1. Technical Field

The present invention relates to a test apparatus and an electronic device. Particularly, the present invention relates to a test apparatus that tests a device under test and an electronic device including a test circuit.

2. Related Art

Generally, there may be a case that a test pattern having a predetermined logic pattern is generated and inputted to a device under test in order to test the device under test such as a semiconductor circuit. For example, a test to determine whether the device under test normally operates can be performed by writing a predetermined logic value to a memory region in the device under test and reading the written logic pattern.

A pattern generating section that generates a test pattern based on pattern data and sequence data has been known. The pattern generating section sequentially reads the pattern data and the sequence data stored in the main memory and stores the same in the cache memory.

Here, the following documents have been known as the related art documents of the pattern generating section:
1. International Publication (WO) 2004/109307 brochure
2. International Publication (WO) 1998/23968 brochure
3. Japanese Patent Application Publication No. 8-94724
4. Japanese Patent Application Publication No. 10-78476

As described above, the pattern generating section generates a test pattern based on the data previously stored in the main memory. Therefore, when longer test pattern is generated, larger main memory may be required for the pattern generating section. However, the cost is increased in order to increase a memory capacity. Thus, a method is desired for generating longer test pattern without increasing the memory capacity.

Meanwhile, the speed of transferring data from the main memory to the cache memory often becomes a bottleneck for the operating speed of the pattern generating section. Therefore, even if the same test pattern is generated, it is desired that the amount of transferring data from the main memory to the cache memory is reduced as far as possible.

SUMMARY

Accordingly, it is an advantage of the invention to provide a test apparatus and an electronic device which are capable of solving the above-mentioned problem. This advantage may be achieved through the combination of features described in independent claims of the invention. Dependent claims thereof specify preferable embodiments of the invention.

Thus, a first aspect of the present invention provides a test apparatus that tests a device under test. The test apparatus includes: a main memory that stores pattern data including at least one pattern bit defining a test signal provided to each of a plurality of terminals of the device under test; a pattern cache memory that caches the pattern data read from the main memory; a pattern generation control section that reads pattern data from the main memory and writes the same to the pattern cache memory; a pattern generating section that sequentially reads the pattern data stored in each cache entry of the pattern cache memory and outputs the same; and a channel circuit that generates a test signal corresponding to each of the plurality of terminals based on the pattern data outputted from the pattern generating section and provides the same to the device under test. The Pattern generating section includes a replicating section that replicates at least one pattern bit as Pattern bits corresponding to two or more terminals to generate pattern data including pattern bits For the plurality of terminals; and writing section that writes the pattern data including the pattern Bits for the plurality of terminals to the pattern cache memory.

a second aspect of the present invention provides an electronic device. The electronic Device includes a circuit under test that operates in accordance with a signal inputted to the device At the time at which the device is actually operated and a test circuit that tests the circuit under test.

The test circuit includes: a main memory that stores pattern data including at least one pattern bit defining a test signal provided to each of a plurality of terminals of the circuit under test; a pattern cache memory that caches the pattern data read from the main memory; a pattern generation control section that reads pattern data from the main memory and writes the same to the pattern cache memory; a pattern generating section that sequentially reads the pattern data stored in each cache entry of the pattern cache memory and outputs the same; and a channel circuit that generates a test signal corresponding to each of the plurality of terminals based on the pattern data outputted from the pattern generating section and provides the same to the device under test. The pattern generating section includes: a replicating section that replicates at least one pattern bit as pattern bits corresponding to two or more terminals to generate pattern data including pattern bits for the plurality of terminals; and a writing section that writes the pattern data including the pattern bits for the plurality of terminals to the pattern cache memory.

It is noted that the summary of the invention described above does not necessarily describe all necessary features of the invention. The invention may also be a sub-combination of the features described above.

DESCRIPTION OF EXEMPLARY EMBODIMENTS

The invention will now be described based on preferred embodiments, which do not intend to limit the scope of the invention, but exemplify the invention. All of the features and the combinations thereof described in the embodiments are not necessarily essential to the invention.

Figure 1:
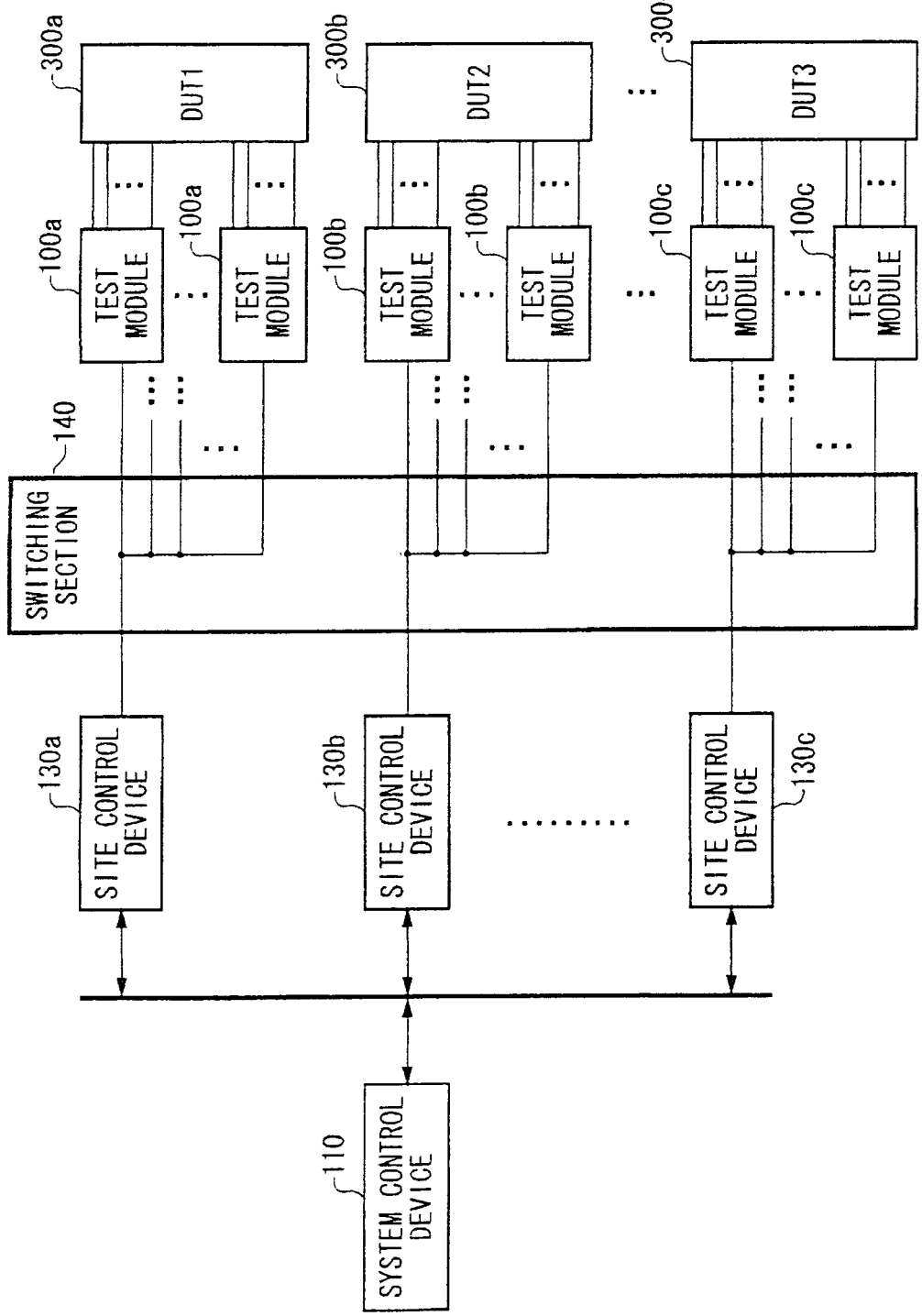
FIG. 1 shows an example of the configuration of a test apparatus 200 according to an embodiment of the present invention.

FIG. 1 shows an example of configuration of a test apparatus 200 according to an embodiment of the present invention. The test apparatus 200 tests device under tests 300 such as semiconductor circuits and includes a system control device 110, a plurality of site control devices 130, a switching section 140 and a plurality of test modules 100.

The system control device 110 receives a test control program, test program data and test pattern data to test the device under tests 300 through an external network and stores therein the same. The plurality of site control devices 130 are connected to the system control device 110 through a communication network.

The site control devices 130a-c controls to test any of the device under tests 300. For example, each of the plurality of site control devices 130 is aligned corresponding to each of the device under tests 30 one on one. Each of the site control devices 130 controls the corresponding device under test 300.

The site control device 130a controls to test the device under test 300a, and the site control device 130b controls to test the device under test 300b in FIG. 1. Alternatively, the plurality of site control devices 130 may control to each of the plurality of device under tests 300, respectively.

Specifically, the site control device 130 acquires the test control program from the system control device 110 and executes the same. Next, the site control device 130 acquires from the system control device 110 the test program data such as sequence data described later and the test pattern data such as pattern data described later used to test the corresponding device under test 300 based on the test control program.

In addition, the site control device 130 stores in one or more test modules 100 used to test the device under tests 300 through the switching section 140. Next, the site control device 130 instructs the test modules 100 to start to test in accordance with the test program data and the test pattern data through the switching section 140. Then, the site control device 130 receives such as an interrupt indicating that the test is terminated from the test modules 100 and causes the test modules 100 to perform the next test based on the test result.

The switching section 140 connects each of the plurality of site control devices 130 to the plurality of test modules 100 controlled by the each of the plurality of site control devices 130 and relays the communication therebetween. Here, a predetermined site control device 130 may set the switching section 140 in order to connect each of the site control devices 130 to one or more test modules used to test the device under test 300 by the site control device 130 based on the instruction by such as the user of the test apparatus 200 and the test control program.

For example, the site control device 130a is set to be connected to the plurality of test modules 100a and tests the device under test 300a by using the plurality of test modules 100 in FIG. 1. Here, the configuration and the operation of the other site control devices 130 to test the device under tests 300 by using the test modules 100 may be the same as those of the site control device 130a to test the device under test 300a. Hereinafter, it hill be mainly described that the configuration and the operation of the site control device 130a to test the device under test 300a.

The test module 100a generates a timing signal appropriate for generating a test signal used to test the device under test 300a based on the instruction by the site control device 130a. In addition, any of the test modules 100a may receive the test result of the other test module 100a and cause the plurality of test modules 100a to execute the sequence corresponding to pass/fail of the test result.

Each of the plurality of test modules 100a is connected to each of a plurality of terminals included in the device under test 300a and tests the device under test 300a based on the sequence data and the pattern data stored in the site control device 130a. Testing the device under test 300a, the test modules 100a generate test signals from the pattern data based on the sequence data and the pattern data designated by a pattern list described later and provides the test signal to the terminal of the device under test 300a connected to the test module 100a.

Next, each of the test modules 100a acquires an output signal as the result that the device under test 300a operates based on the test signal and compares the same with an expected value. Here, each of the plurality of test modules 100a may generate a test signal based on cycle periods different from each other in order to dynamically change the cycle period of the test signal based on the sequence data and the pattern data.

In addition, completing the processing of the test program data, the test module 100a generates an interrupt on the site control device 130a when any failure occurs during executing the test program data. The interrupt is notified to the site control device 130a corresponding to the test module 100a through the switching section 140, so that a processor included in the site control device 130a performs an interrupt processing.

Here, the test apparatus 200 is provided by an open architecture, and can use various modules which meets the open architecture standard. Then, the test apparatus 200 can insert the module such as the test module 100 into any connecting slot included in the switching section 140.

In this case, the user of the test apparatus 200 can change the connection configuration through such as the site control device 130a and connect a plurality of modules used to test the device under tests 300 to the site control devices 130 to control to test the device under tests 300. Thereby the user of the test apparatus 200 can select the appropriate module dependent on the number of terminals, the placement of terminals, the kind of terminals or the kind of test for each of the plurality of device under tests 300 and implement the same in the test apparatus 200.

In addition, the test apparatus 200 or the test module 100 may be a test circuit provided in the same electronic device in which the targeted circuit under test is provided. The test circuit is provided as such as a BIST circuit of the electronic device and diagnoses the electronic device by testing the circuit under test. Thereby the test circuit can check whether a circuit to be a circuit under test can normally perform the original operation as a circuit under test.

In addition, the test apparatus 200 or the test module 100 may be a test circuit provided on the same board or in the same apparatus on/in which a circuit under test is provided. Such test circuit also can check whether the circuit under test can normally perform the original operation as an electronic device.

Figure 2:
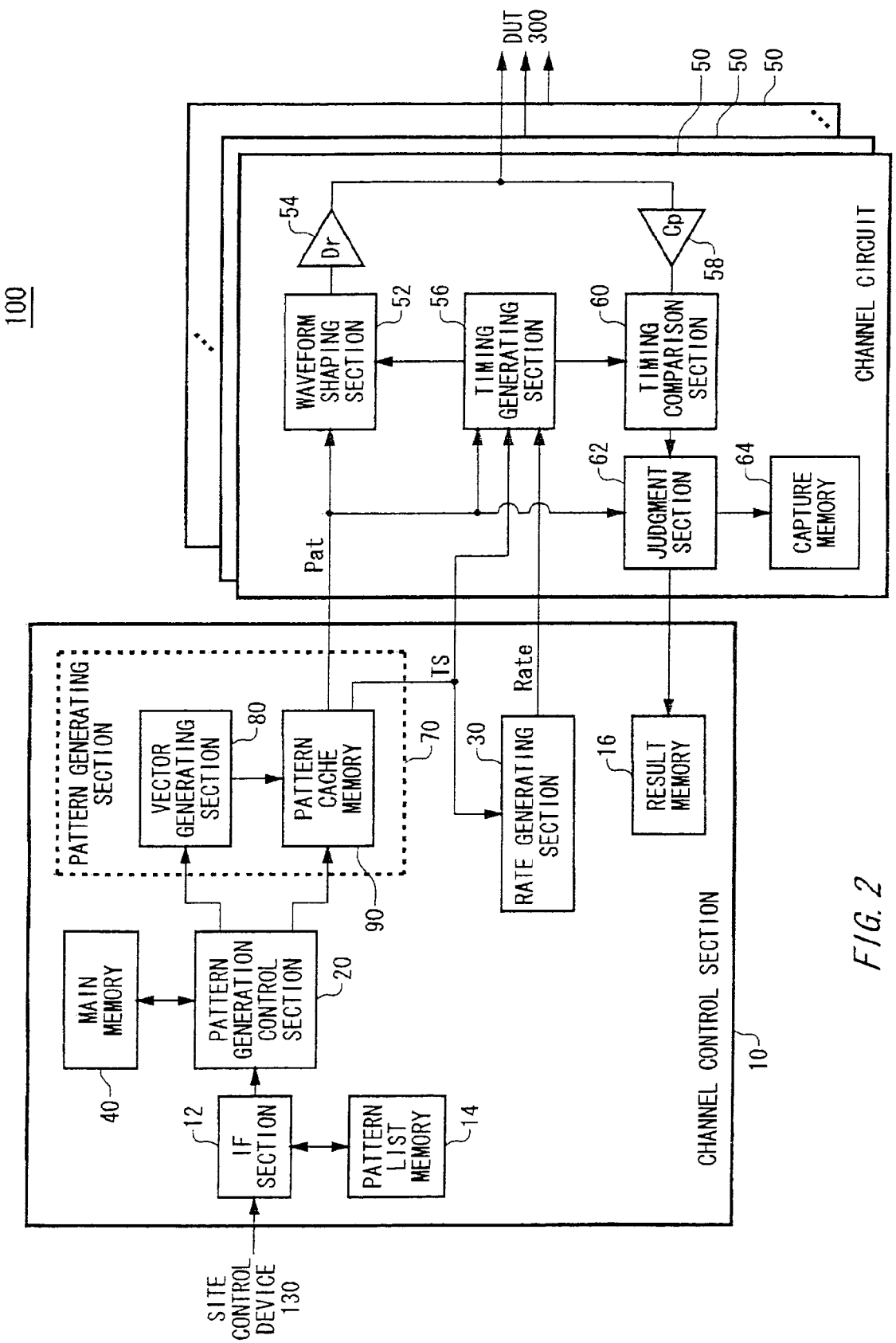
FIG. 2 shows an example of the configuration of a test module 100.

FIG. 2 shows an example of configuration of the test module 100. The test module 100 includes a channel control section 10 and a plurality of channel circuits 50. The function and the configuration of one channel circuit 50 will be described in the present embodiment. However, the other channel circuits may be the same function and configuration.

Each of the channel circuits 50 may be connected to input and output pin corresponding to the device under test 300 and provide a test signal to the input and output pins. In addition, each of the channel circuits 50 may measure an output signal from the input/output pins. Here, the input and output pins of the device under test 300 may be either the input pin or the output pin.

The channel control section 10 controls each of the channel circuits 50. For example, the channel control section 10 controls each of the channel circuits 50 to generate a test signal. In addition, the channel control section 10 controls each of the channel circuits 50 to measure an output signal from the device under test 300.

In addition, the channel control section 10 may control the other channel circuit 50 based on the measurement result of any channel circuit 50. For example, the channel control section 10 may cause at least one of the other channel circuits 50 to repeatedly perform a predetermined operation until the measurement result of any of the channel circuits 50 satisfies a predetermined condition and causes the other channel circuit 50 to perform the next appropriate operation provided that the measurement result satisfies the predetermined condition.

The channel control section 10 includes an interface section 12, a pattern list memory 14, a result memory 16, a pattern generation controlling section 20, a main memory 40, a rate generating section 30 and a pattern generating section 70. The interface section 12 passes the data between the site control devices 130 and the test modules 100.

The main memory 40 stores therein the plural kinds of sequence data and pattern data corresponding to the sequence data. The main memory 40 may previously store the sequence data and the pattern data provided from the site control devices 130 before testing the device under test 300. In addition, the main memory 40 may compress and stores the sequence data and the pattern data.

For example, the site control section 130 may input to the interface section 12 the sequence data, the pattern data and an instruction to store those data on the designated addresses of the main memory 40. The pattern generation control section 20 stores those data in the main memory 40 in accordance with the instruction received by the interface section 12.

The sequence data may be data indicative of an instruction group to be sequentially executed, for example. For example, the sequence data may include a plurality of data indicative of an instruction to be executed for each test cycle.

The pattern data is data indicative of such as a logical value pattern, and may be stored in association with a plurality of instructions of the sequence data one-on-one. The pattern data may include a plurality of cycle data corresponding to the plurality of instructions of the sequence data. For example, the sequence data may be an instruction group cause to generate a test pattern by outputting each of the cycle data in a predetermined order.

At this time, the sequence data may generate the test pattern by using each of the pattern data several times. For example, the sequence data may include such as a loop instruction and a jump instruction. When the channel control section 10 executes such sequence data, the corresponding pattern data is sequentially outputted in order corresponding to the sequence data to generate a test signal corresponding to the sequence data and the pattern data. An example of the sequence data and pattern data stored in the main memory 40 will be described later with reference to FIG. 3.

The pattern list memory 14 stores therein a pattern list indicative of an appropriate order of executing the sequence data stored in the main memory 40. For example, the pattern list memory 14 may store the pattern list that sequentially designates addresses of the sequence data to be executed in the main memory 40. The pattern list memory 14 may previously store the pattern list provided from the site control devices 130 before testing the device under test 300 as well as the main memory 40. The pattern list may be an example of the above described test control program and also may be a part of the test control program.

The pattern generation control section 20 reads the pattern list from the pattern list memory 14 when the test apparatus 200 starts to test the device under test 300. For example, receiving an instruction on the start of the test from the site control device 130, the pattern generation control section 20 may read the pattern list from the pattern list memory 14.

The pattern generating section 20 reads the sequence data and the corresponding pattern data stored in the main memory 40 in the order according to the pattern list. The pattern generation controlling section 20 transmits the read sequence data to a vector generating section 80 of the pattern generating section 70. In addition, the pattern generation control section 20 transmits the read pattern data to a pattern cache memory 90 of the pattern generating section 70.

The pattern generation control section 20 may read the next sequence data and pattern data and transmit the same when there is a predetermined free area in such as a cache memory and a FIFO memory of a subsequent circuit. In this case, the pattern generation control section 20 may read the next sequence data and pattern data provided that there is the predetermined free area in all the cache memory and FIFO which should store the sequence data and the pattern data, and transmit the same to the cache memory and the FIFO.

The pattern generating section 70 sequentially generate test patterns based on the sequence data and the pattern data sequentially received from the pattern generation control section 20. The pattern generating section 70 according to the present embodiment includes the vector generating section 80 and the pattern cache memory 90.

As described above, the vector generating section 80 receives the sequence data from the pattern generation control section 20. The vector generating section 80 may include a sequence cache memory that stores the received sequence data in a predetermined cache entry (hereinafter referred to as an entry). The pattern cache memory 90 receives the pattern data from the pattern generation control section 20 and stores the same in the predetermined entry in units of cycle data. The entry may be a storage area which is designated by one or more addresses.

The vector generating section 80 sequentially executes the sequence data stored in the sequence cache memory and sequentially designates the addresses in the pattern cache memory 90. For example, the address of the pattern data to be designated according to instructions may be associated with each of the instructions of the sequence data. Then, the vector generating section 80 sequentially designates the addresses in the pattern cache memory 90 according to such as a loop instruction and a jump instruction included in the sequence data.

The pattern cache memory 90 outputs the pattern data of the addresses sequentially designated. Thereby a test pattern having a logic pattern in accordance with the sequence data and the pattern data can be generated. In addition, the sequence cache memory and the pattern cache memory 90 may open the storage area for the sequence data and the corresponding pattern data, after the sequence data is completely executed. The sequence data may include a termination instruction indicative of the termination of the sequence data at the end of the instruction group.

Each of the channel circuits 50 shapes a test signal based on the test pattern outputted by the pattern generating section and inputs the same to the device under test 300. In addition, each of the channel circuits 50 measures an output signal from the device under test 300. Each of the channel circuit 50 includes an waveform shaping section 52, a driver 54, a timing generating section 56, a comparator 58, a timing comparison section 60, a judgment section 62 and a capture memory 64.

The waveform shaping section 52 shapes the test signal based on the test pattern generated by the pattern generating section 70. For example, the waveform shaping section 52 may generate a test signal having a logic pattern in accordance with the test pattern. In addition, the waveform shaping section 52 may generate a test signal in accordance with a given timing signal. For example, the waveform shaping section 52 may generate a test signal of which logical value is changed in accordance with the given timing signal.

The driver 54 inputs the test signal generated by the waveform shaping section 52 to the device under test 300. The driver 54 may convert the voltage level of the test signal to the signal level appropriate to be inputted to the device under test 300 by outputting the voltage at a predetermined level H when the test signal generated by the waveform shaping section 52 indicates logic H, and by outputting the voltage at a predetermined level L when the test signal indicates logic L.

The comparator 58 may receive the output signal from the device under test 300, and convert the output signal to a binary logic signal by comparing the voltage level of the output signal with a preset reference level. For example, the comparator 58 may output logic H when the voltage level of the output signal is higher than the reference level, and output logic L when the voltage level of the output signal is lower than the reference level.

The timing comparison section 60 acquires the logical value of the signal outputted by the comparator 58 in accordance with a given strobe signal. Thereby the logic pattern of the output signal can be detected.

The timing generating section 56 generates the timing signal and the strobe signal described above in accordance with a setting value of a prepared timing set. For example, the timing generating section 56 may generate a timing signal and a strobe signal obtained by delaying a rate signal provided from the rate generating section 30 at a period corresponding to the timing set by the amount of delay corresponding to the given timing set.

The timing set may be provided to the rate generating section 30 and the timing generating section 56 every time one sequence data is executed, for example. The main memory 40 may include the data of the timing set as a part of the pattern data corresponding to the sequence data, for example. The pattern generating section 70 may set the timing set corresponding to the sequence data to the rate generating section 30 and the timing generating section 56 every time each sequence data is executed.

The judgment section 62 compares the logic pattern detected by the timing comparison section 60 with an expected value pattern. Thereby pass/fail of the device under test 300 can be judged. The expected value pattern may be generated by the pattern generating section 70. For example, the expected value pattern may be equal to the logic pattern of the test signal inputted to the device under test 300, which is included in the test pattern generated by the pattern generating section 70.

The capture memory 64 stores the result by the judgment section 62. For example, the capture memory 64 may store therein a result of pass (matching) and fail (mismatching) by the judgment section 62 for each test pattern. In addition, the capture memory 64 may select the result of fail by the judgment section 62 and store therein the same.

The result memory 16 of the channel control section 10 stores the result by the judgment section 62 in each channel circuit 50. The result memory 16 may store therein the result of pass (matching) and fail (mismatching) by the each of the judgment sections 62 in association with each channel for each test pattern. The result memory 16 may select the result of fail by each of the judgment sections 62 and store therein the same.

As described above, the capture memory 64 may store therein for each channel circuit 50 the fail information for each test pattern. Meanwhile, the result memory 16 may store for each device under test 300 the fail information for each sequence data stored in the pattern list memory 14.

Figure 3:
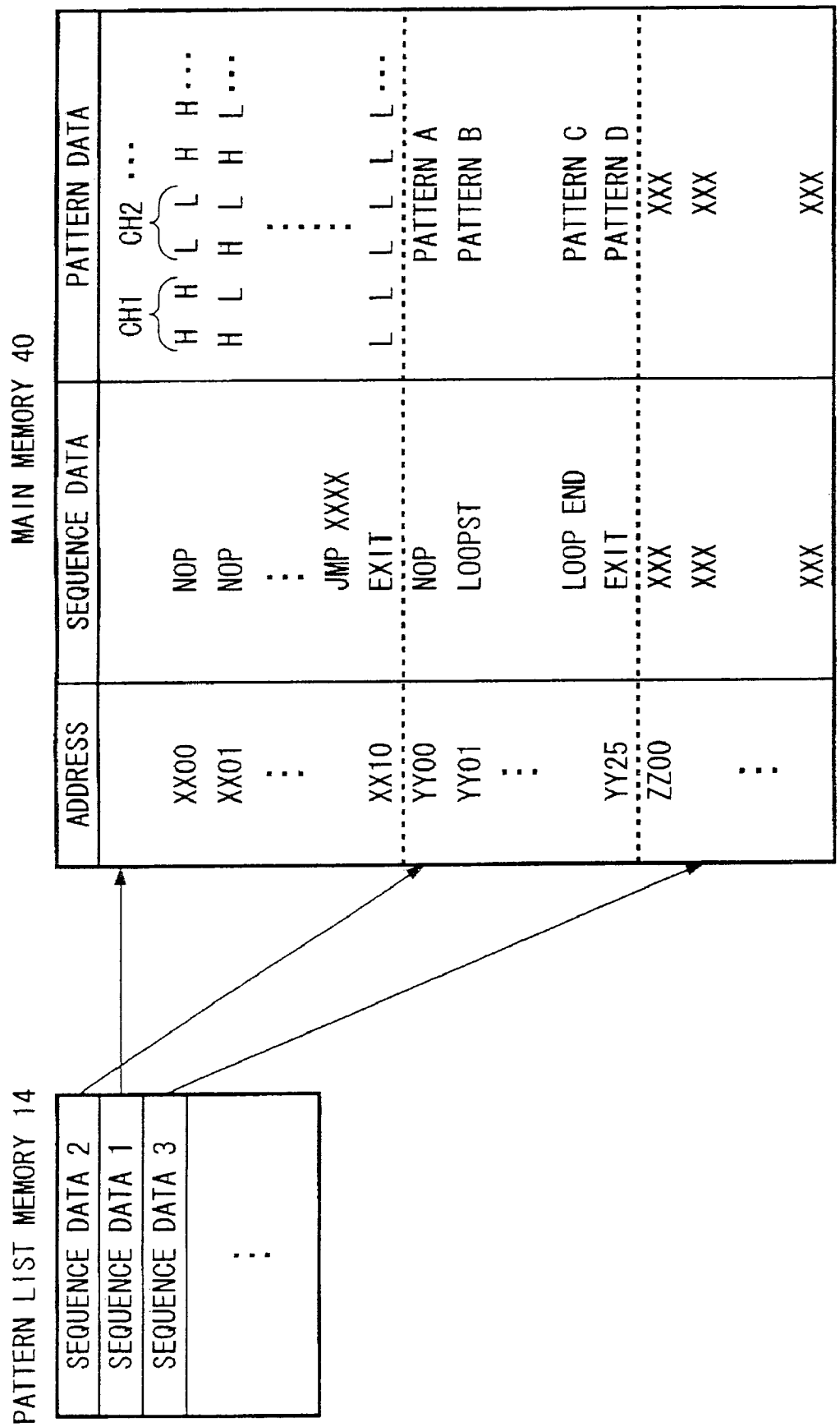
FIG. 3 is explanatory diagram showing an example of pattern lists stored in a pattern list memory 14, and sequence data and pattern data stored in a main memory 40.

FIG. 3 is explanatory diagram showing an example of pattern lists stored in the pattern list memory 14, and sequence data and pattern data stored in a main memory 40. As described above, the main memory 40 stores a plurality of sequence data (sequence data 1, sequence data 2 . . . ) and the pattern data each of which is corresponding to each sequence data.

As described above, the sequence data includes a plurality of instructions. When each of the instructions are executed, the pattern generating section 70 may output the cycle data corresponding to each of the instructions. For example, the sequence data may include NOP instruction to output the corresponding cycle data and shift the following instruction, JMP instruction to output the corresponding cycle data and further jump to the instruction at a predetermined address and LOOP instruction to output the corresponding cycle data and further repeat the instruction within the designated address range a predetermined number of times. The cycle data described above may indicate the logic pattern corresponding to each instruction.

By executing such instruction group, the cycle data for each pattern data is outputted in order corresponding to the sequence data in units of test cycle to generate a predetermined test pattern. For example, when the sequence data 2 is executed, the pattern generating section 70 repeatedly outputs the cycle data B—the cycle data C the number of times designated by the LOOP instruction after outputting the pattern data A.

The main memory 40 may store therein the sequence data common to the plurality of channel circuits 50. In addition, the main memory 40 may store the pattern data for each of the channel circuits 50. For example, the main memory 40 may store the pattern data corresponding to the plurality of channel circuits for each of the instructions of the sequence data. The main memory 40 stores therein the pattern data corresponding to each of the channel circuits 50 at the bit position of which address is different from each other in FIG. 3.

The pattern memory 14 stores therein the order of the sequence data to be executed. The pattern list memory 14 stores a pattern list to sequentially designate the sequence data 2 and the sequence data 1 in FIG. 3.

The main memory 40 that stores therein the sequence data and the pattern data is provided in the channel control section 10 in the embodiment shown in FIG. 2. Meanwhile, the main memory 40 that stores therein the sequence data may be provided in the channel control section 10, and a memory that stores therein the pattern data for each of the channel circuits 50 may be provided in each of the channel circuits 50 in the other embodiment.

In this case, the pattern cache memory 90 may be provided in each of the channel circuits 50. Then, the addresses sequentially designated by the vector generating section 80 may be distributed to the pattern cache memory 90 provided in each of the channel circuits 50.

Figure 4:
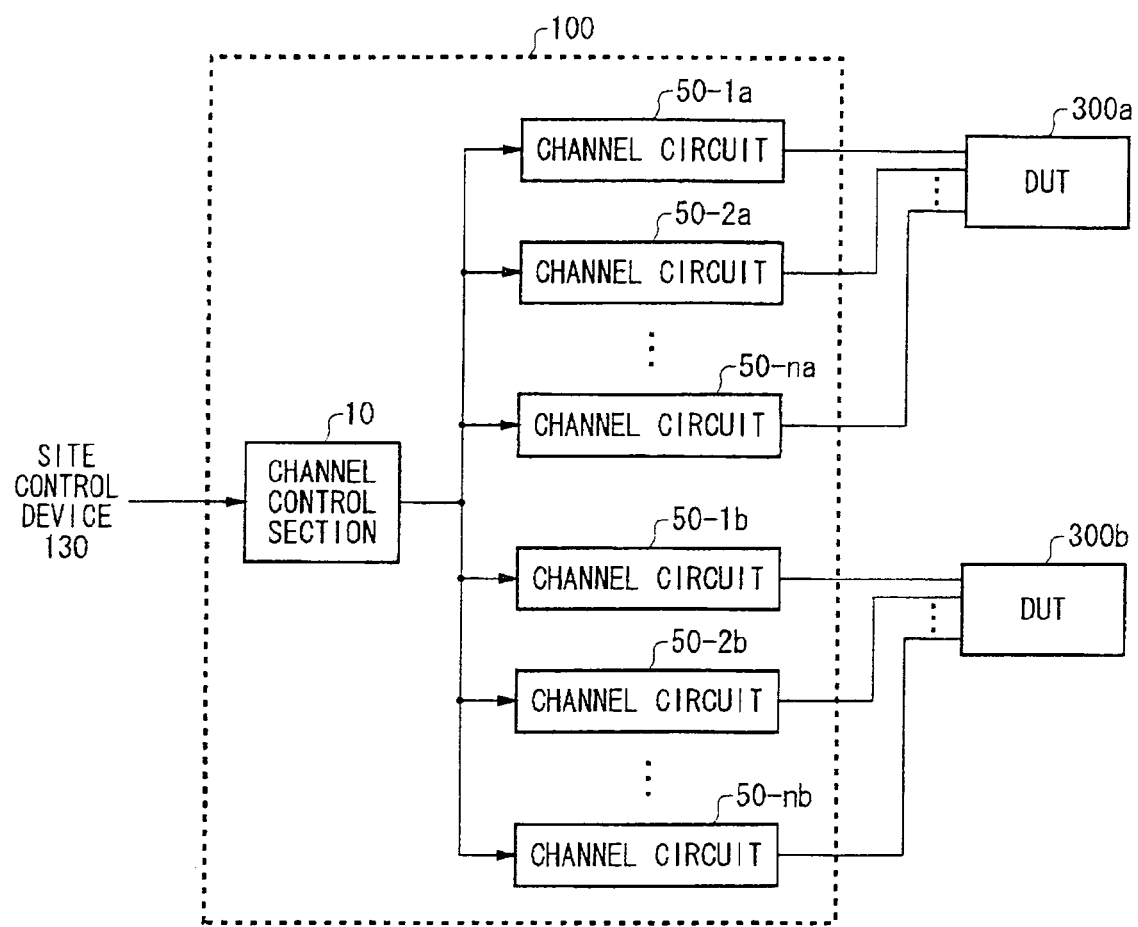
FIG. 4 shows an example of connection of the test module 100 and the device under tests 300.

FIG. 4 shows an example of connection of the test module 100 and the device under tests 300. The test module 100 according to the present embodiment connects a plurality of device under tests in parallel and tests the plurality of device under tests in parallel. For an operative example, a case that the test module 100 tests two device under tests 300*a* and 300*b* will be described. The two device under tests 300*a* and 300*b* may be the same kind of electronic devices.

The test module 100 performs substantially the same processing on the device under test 300*a* and 300*b*, respectively. For example, the channel control section 10 may store the sequence data and pattern data common to the two device under tests 300*a* and 300*b*. In addition, n-th channel circuits (where, n is any natural number) are connected to each of the device under test 300*a* and 300*b*.

Channel circuits 50-1*a*-50-*na* (hereinafter generically referred to as 50-*a*) are connected to the first device under test 300*a* in the present embodiment. Meanwhile, channel circuits 50-1*b*-50-*nb*, (hereinafter generically referred to as 50-*b*) are connected to the second device under test 300*b*.

The same test pattern may be provided to the channel circuits 50 connected to the terminals of the same device under test 300. For example, the same test pattern may be provided to the channel circuit 50-1*a* and the channel circuit 50-1*b*.

The pattern generation control section 20 may replicate at least a part of one pattern data corresponding to the plurality of device under tests 300 (or the plurality of terminals of one device under test 300). In this case, the pattern generation control section 20 may generate a test pattern to be inputted to each of the device under tests 300 based on the each pattern data replicated and provide the same to the plurality of channel circuits 50 corresponding thereto.

In addition, the pattern generation control section 20 may generate one test pattern based on one pattern data. In this case, the pattern generation control section 20 may replicate at least a part of generated test pattern corresponding to the plurality of device under tests 300 and provide the same to the plurality of channel circuits 50 corresponding thereto.

By such processing, the amount of data stored in the main memory 40 can be reduced. For example, more test patterns can be generated by the data stored in the main memory 40 having the same capacity. Moreover, when the same test pattern is generated, the capacity appropriate for the main memory 40 can be reduced.

Moreover, when the same test pattern is generated, the amount of data read from the main memory 40 can be reduced. Therefore, the amount of transferring data from the main memory 40 in order to generate the test pattern can be reduced, so that the test pattern can be generated more speedily.

Figure 5:
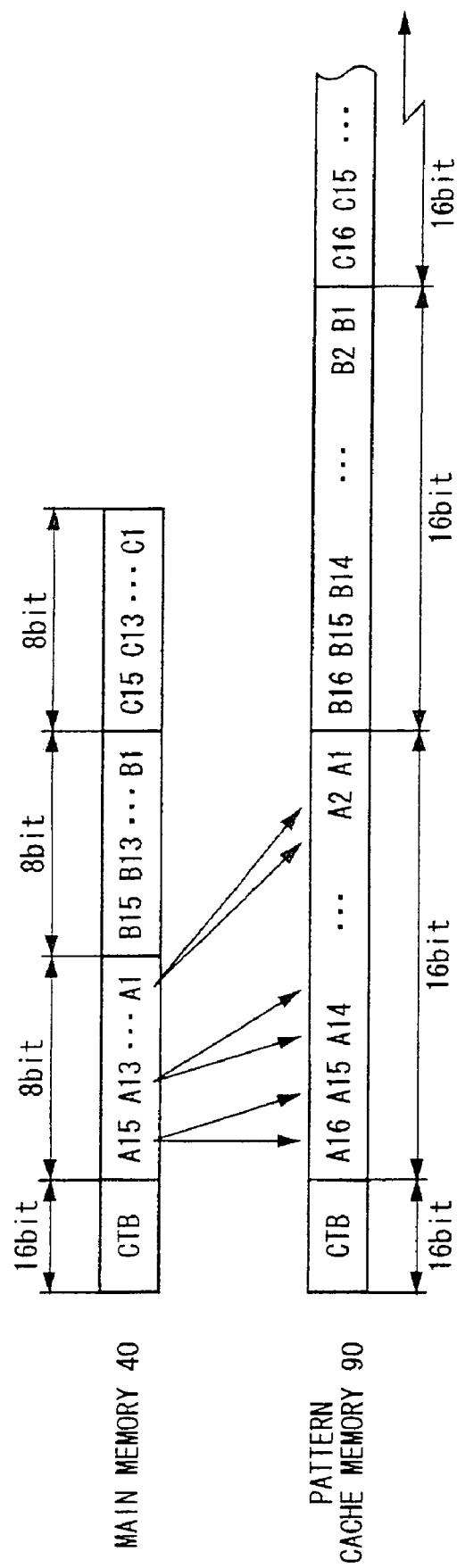
FIG. 5 shows an example of one cycle data included in a pattern data.

FIG. 5 shows an example of one cycle data included in a pattern data. It will be described that at least a part of pattern data is replicated for the plurality of device under tests 300 in the present embodiment. The cycle data may be data indicative of the logical value to be outputted from each channel circuit 50 for the corresponding cycle. Here, the same sequence data may be used by the plurality of device under tests 300.

A predetermined information is placed at each bit position in the cycle data stored in the main memory 40. For example, in the cycle data shown in FIG. 7, control bit CTB is arranged from the head bit up to 16 bit, and pattern bits (A15, A13, ... A1, B15, B13, ... B1, C15, C13, ... C1) are arranged within next 24 bit.

A plurality of pattern bits may indicate the logical value to be outputted from the plurality of channel circuits 50 for the test cycle corresponding to the cycle data. That is, the plurality of pattern bits may indicate the logical value to be inputted to each terminal of the device under test 300 for the test cycle. The bits A1, B1 and C1 may indicate the logical values to be outputted from the first channel circuit 50-1*a* shown in FIG. 4, respectively in the present embodiment.

In addition, the plurality of pattern bits may indicate the logical values which should be outputted by the channel circuits 50-1*a*-50-*na* corresponding to one device under test 300*a* among the channel circuits 50 shown in FIG. 4 for the test cycle. For example, the pattern bits A1, B1 and C1 may be corresponding to the channel circuit 50-1*a*, the pattern bits A3, B3 and C3 may be corresponding to the channel circuit 50-2*a*, and the pattern bits A15, B15 and C15 may be corresponding to the channel circuit 50-8*a*, respectively.

The pattern generation control section 20 replicates at least one pattern bit as pattern bits corresponding to the plurality of terminals of the device under test 300 to generate cycle data corresponding to the plurality of terminals. The pattern generation control section 20 according to the present embodiment replicates the pattern bits (A1, B1, C1, A3, B3, C3, ..., A16, B15, C15) corresponding to the channel circuits 50-1*a*-50-*na* corresponding to the terminals of the first device under test 300 as the pattern bits (A2, B2, C2, A4, B4, C4, ..., A15, B16, C16) corresponding to the channel circuits 50-1*b*-50-*nb* corresponding to the terminals of the second device under test 300*b* to generate cycle data.

The pattern generation control section 20 may use any bit other than the pattern bits of each cycle data without replicating. For example, the pattern generation control section 20 may generate cycle data obtained by replicating at least one pattern bit by using the control bit for each cycle data without replicating.

The pattern generation control section 20 stores the cycle data obtained by replicating the pattern bits in the cache memory 90. Each of the channel circuits 50 generates a test signal in accordance with the corresponding pattern bit for each cycle data stored in the cache memory 90. The pattern generation control section 20 may previously set therein information indicating which of pattern bits for each cycle data is replicated as the pattern bit corresponding to any of the channel circuits 50.

For example, when the same test signal is provided to the terminals corresponding to the first device under test 300*a* and the second device under test 300*b* to measure the first device under test 300*a* and the second device under test 300*b* at the same time, the pattern generation control section 20 may replicate the pattern bit for each terminal of the first device under test 300*a* as the pattern bit for each terminal of the second device under test 300*b*.

Hereinbefore, a case has been described that two device under tests 200 are measured at the same time. However, when more device under tests 300 are measured at the same time, the main memory 40 may store one pattern bit common to at least one set of terminals corresponding to each of the device under tests 300. The pattern generation control section 20 may replicate the common pattern bit stored in the main memory 40 as the pattern bit for each of the plurality of device under tests 300 to generate each cycle data.

Moreover, the main memory 40 may store one pattern bit common to a plurality of terminals of one device under test 300. The pattern generation control section 20 may replicate the common pattern bit stored in the main memory 40 as the pattern bits for two or more terminals to generate each cycle data. In any case, the pattern cache memory 90 may store each cycle data generated by which the pattern generation control section 20 replicates the pattern bit.

By such processing, the amount of data stored in the main memory 40 is reduced to improve the utilization ratio of the memory. Moreover, when the same test pattern is generated, the amount of data read from the main memory 40 is reduced, so that the generation speed of the test pattern can be improved.

Figure 6:
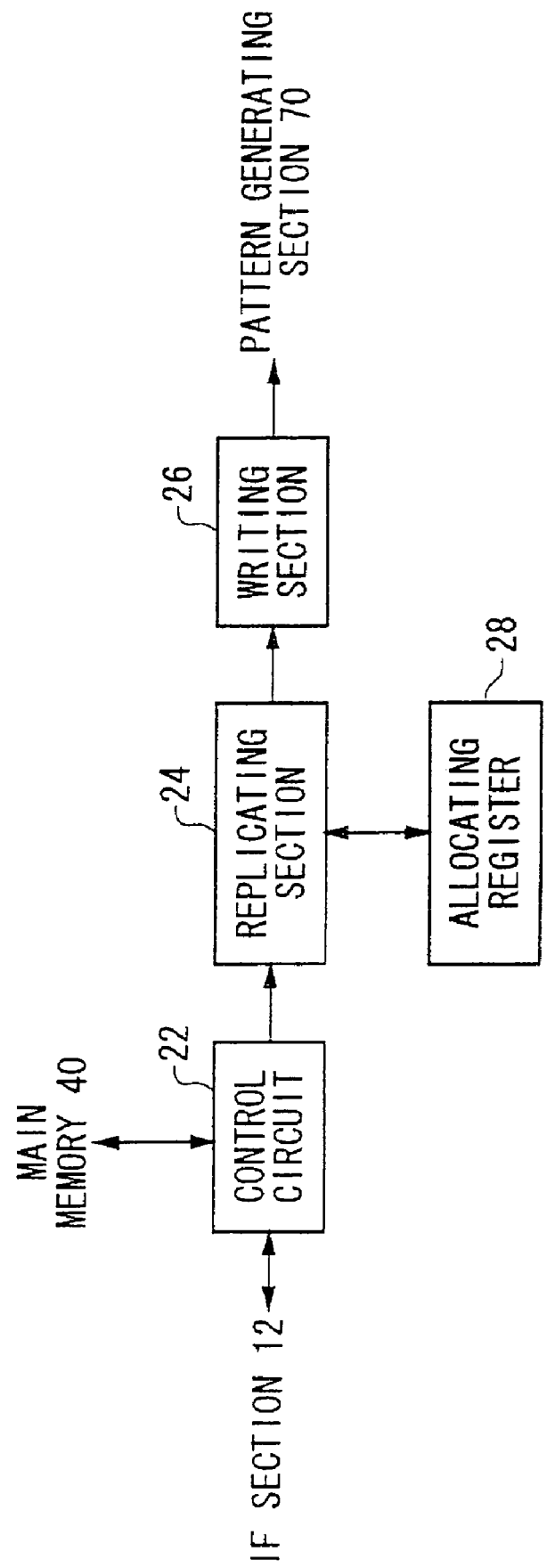
FIG. 6 shows an example of configuration of the pattern generation controlling section 20.

FIG. 6 shows an example of configuration of the pattern generation controlling section 20. A configuration to provide the function described with reference to FIG. 5 will be described in the present embodiment. Here, the pattern generation control section 20 may further include the configuration to provide the function described with reference to FIG. 1-FIG. 4. The pattern generation control section 20 according to the present embodiment includes a control circuit 22, a replicating section 24, a writing section 26 and an allocating register 28.

The control circuit 22 transfers data to/from the interface section 12 and the main memory 40. As described above, the control circuit 22 may write the test data provided from the interface section 12 to the main memory 40 and read the data from the main memory 40. In addition, the control circuit 22 sequentially inputs the memory data read from the main memory 40 in units of word to the replicating section 24. The memory data may include a plurality of cycle data. the control circuit 22 may extract each cycle data from the memory data and input the same to the replicating section 24 for each cycle data.

The replicating section 24 replicates at least one pattern bit of cycle data received from the control circuit 22 to generate cycle data corresponding to the plurality of channel circuits 50. The allocating register 28 designates any terminal of the device under test 300 to which each pattern bit included in the cycle data read from the main memory is allocated and which is replicated by the replicating section 24. Designating information may be previously set to the allocating register 28 and also may be set by such as the site control device 130 according to the test program. In this case, the test program may include the designating information.

The writing section 26 stores each cycle data generated by the replicating section 24 in the pattern cache memory 90 of the pattern generating section 70. The writing section 26 may store one cycle data on one entry of the pattern cache memory 90. The pattern generating section 70 outputs the cycle data stored on each entry of the pattern cache memory 90 in the order designated by the sequence data to generate the test pattern for each channel circuit 50.

In a first operation mode in which the pattern data including the pattern bits for the terminals to which the test signal should be inputted is stored in the main memory 40, the writing section 26 may directly write each cycle data of the pattern data read from the main memory 40 to the pattern cache memory 90. In this case, the replicating section 24 may extract each cycle data from the memory data read from the main memory 40 and provide directly the extracted cycle data to the writing section 26.

Meanwhile, in a second operation mode in which the pattern data having the pattern bits less than the number of terminals to which the test signals should be inputted is stored in the main memory 40 as described above, the writing section 26 may write cycle data generated by which the replicating section 24 replicates at least one pattern bit to the pattern cache memory 90.

The allocating register 28 may designate that the replicating section 24 and the writing section 26 should operate either the first operation mode or the second operation mode. The designating information for designating the operation mode may be previously set by such as the user and the site control device 130 as described above.

The replicating section 24 may replicate each of two or more pattern bits corresponding to two or more terminals among the plurality of terminals of the device under test 300 as the pattern bits corresponding to each of the same number of terminals. For example, the replicating section 24 may replicate the pattern bits (A1, B1, C1, A3, B3, C3, ..., A15, B15, C15) corresponding to the plurality of terminals of the first device under test as the pattern bits (A2, B2, C2, A4, B4, C4, ... A16, B16, C16) corresponding to the same number of terminals of the second device under test 300.

By such processing, the amount of data stored in the main memory 40 can be reduced. In addition, when the same test pattern is generated, the amount of data read from the main memory 40 can be reduced.

Figure 7:
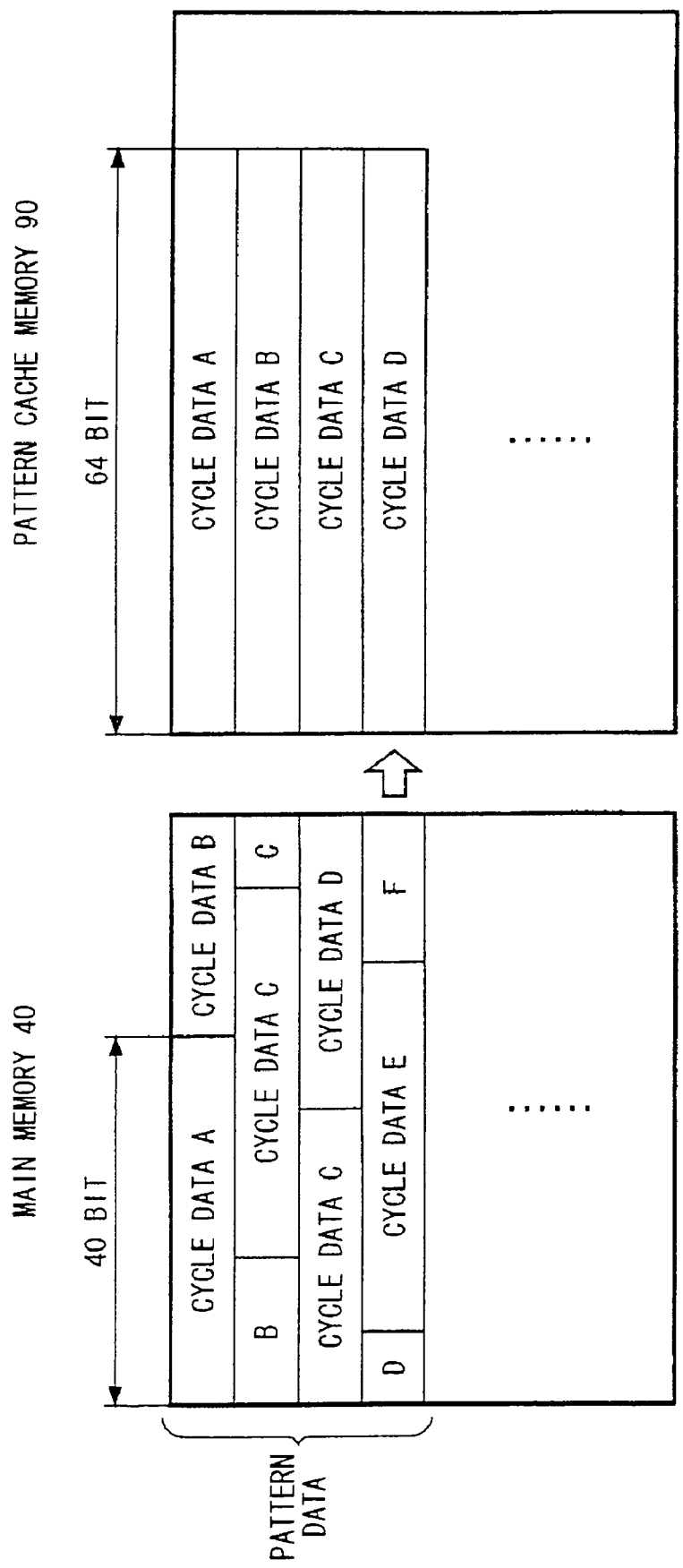
FIG. 7 shows an example of cycle data stored in the main memory 40 and a pattern cache memory 90.

FIG. 7 shows an example of cycle data stored in the main memory 40 and a pattern cache memory 90. As described above, one pattern data may include a plurality of cycle data The main memory 40 may store one cycle data across a plurality of words. The word may be a unit of data transfer for the main memory 40. For example, the control circuit 22 may read one or more words from the main memory 40 for each test cycle.

The control circuit 22 may extract each cycle data from the plurality of words read. For example, the control circuit 22 may generate memory data obtained by connecting the read words and extract each cycle data from the memory data. The control circuit 22 may cut out the data from the memory data obtained by connecting words by the bit number per cycle data to extract the cycle data. As described above, the replicating section 24 and the writing section 26 may store a new cycle data generated by replicating at least one pattern bit of each cycle data on each entry of the pattern cache memory 90.

For example, there is any free area larger than a predetermined size in the pattern cache memory 90, the control circuit 22 may read the word to be stored in the cache memory having the free area from the main memory 40. For example, when there is any free area in the pattern cache memory 90, the control circuit 22 reads the word to be stored in the pattern cache memory 90 next from the main memory 40. Then, the control circuit 22 may notify the writing section 26 of that the cycle data extracted from the read word in the cache memory 90.

The control circuit 22 may have a register that stores therein the address of the word to be read next in the main memory 40. Reading the word from the main memory 40, the control circuit 22 may update the address of the corresponding register. By such processing, the utilization ratio of the main memory 40 can be further improved.

Figure 8:
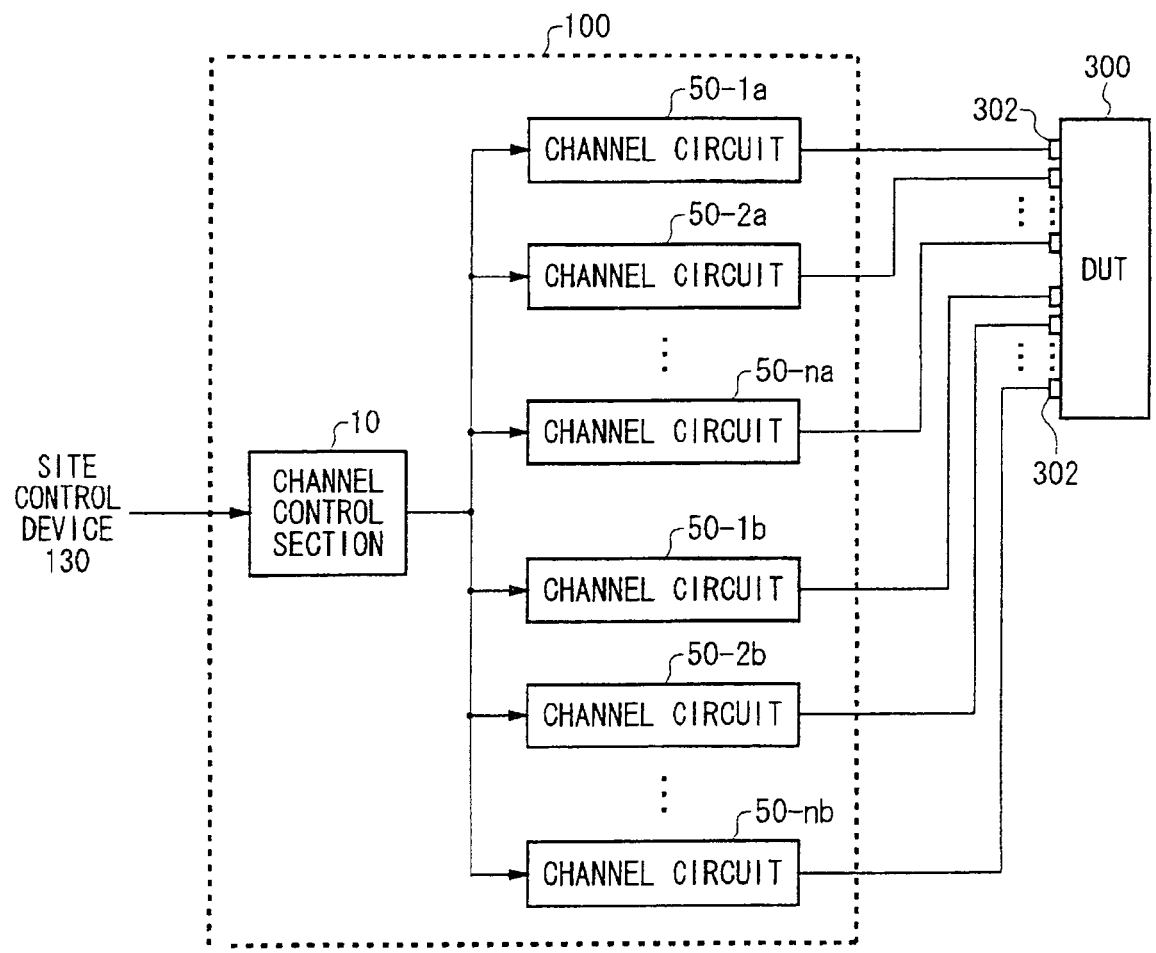
FIG. 8 shows another example of connection of the test module 100 and the device under tests 300.

FIG. 8 shows another example of connection of the test module 100 and the device under tests 300. The test module 100 according to the present embodiment is connected to a plurality of terminals 302 of one device under test 300. In such case, the pattern generation control section 20 may replicate at least one pattern bit for each cycle data read from the main memory 40 to generate a new cycle data.

The main memory 40 may store the pattern bit common to a set of channel circuits 50 which should output the same logical value for each cycle. Then, the pattern generation control section 20 may generate a test pattern to be inputted to the channel circuits 50 based on the cycle data obtained by replicating the common pattern bit.

Figure 9:
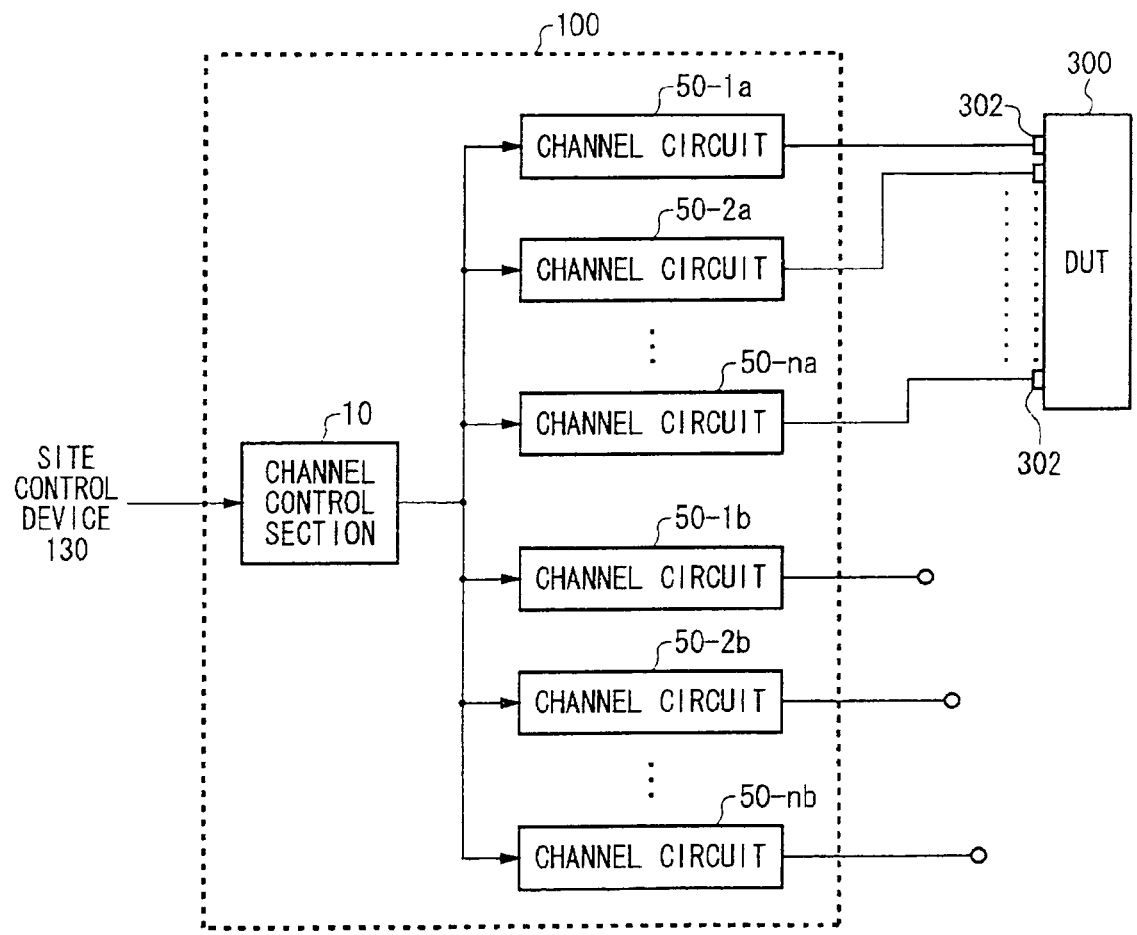
FIG. 9 shows another example of connection of the test module 100 and the device under tests 300.

FIG. 9 shows another example of connection of the test module 100 and the device under tests 300. A part of channel circuits 50 among a plurality of channel circuit 50 are not connected to the device under test 300 in the present embodiment. A case that the test module 10 has 16 channels of channel circuits 50 and 8 channels among them are connected to the device under test 300 will be described, for example.

In this case, the pattern cache memory 90 stores cycle data having the pattern bits corresponding to 16 channels of channels circuits 50. Here, the pattern bits corresponding to the channel circuits 50 not connected to the device under test 300 are unnecessary data not used for testing. Thus, the pattern cache memory 90 stores also the data corresponding to the unused channels circuits 50, so that the test can be performed without changing the other configuration and processing even if the number of channels to be used is changed.

In this case, the main memory 40 may store the cycle data having the pattern bits corresponding to the channel circuits 50 to be connected to the device under test 300. Then, the replicating section 24 may replicate the pattern bits as the pattern bits corresponding to the channel circuits 50 not connected to the device under test 300 described above.

As described above, when half of the channel circuits 50 are connected to the device under test 300, the replicating section 24 may replicate each pattern bit stored in the main memory 40 as one pattern bit adjacent to each other in the pattern cache memory 90. Here, the bit number obtained by which the replicating section 24 replicates one pattern bit in the pattern cache memory 90 is not limited to 1 bit.

For example, the replicating section 24 may replicate one pattern bit for each cycle data stored in the main memory 40 as the pattern bit corresponding to all the channel circuits 50 not connected to the device under test 300. Meanwhile, when third part of the channel circuits 50 are connected to the device under test 300, the replicating section 24 may replicate each pattern bit stored in the main memory 40 as two pattern bits in the pattern cache memory 90.

By such processing, the utilization ratio of the main memory 40 because the data not used for testing is not stored in the main memory 40, so that longer pattern can be stored. Moreover, the amount of data transfer for the main memory can be reduced, so that the pattern can be generated more speedily.

Figure 10:
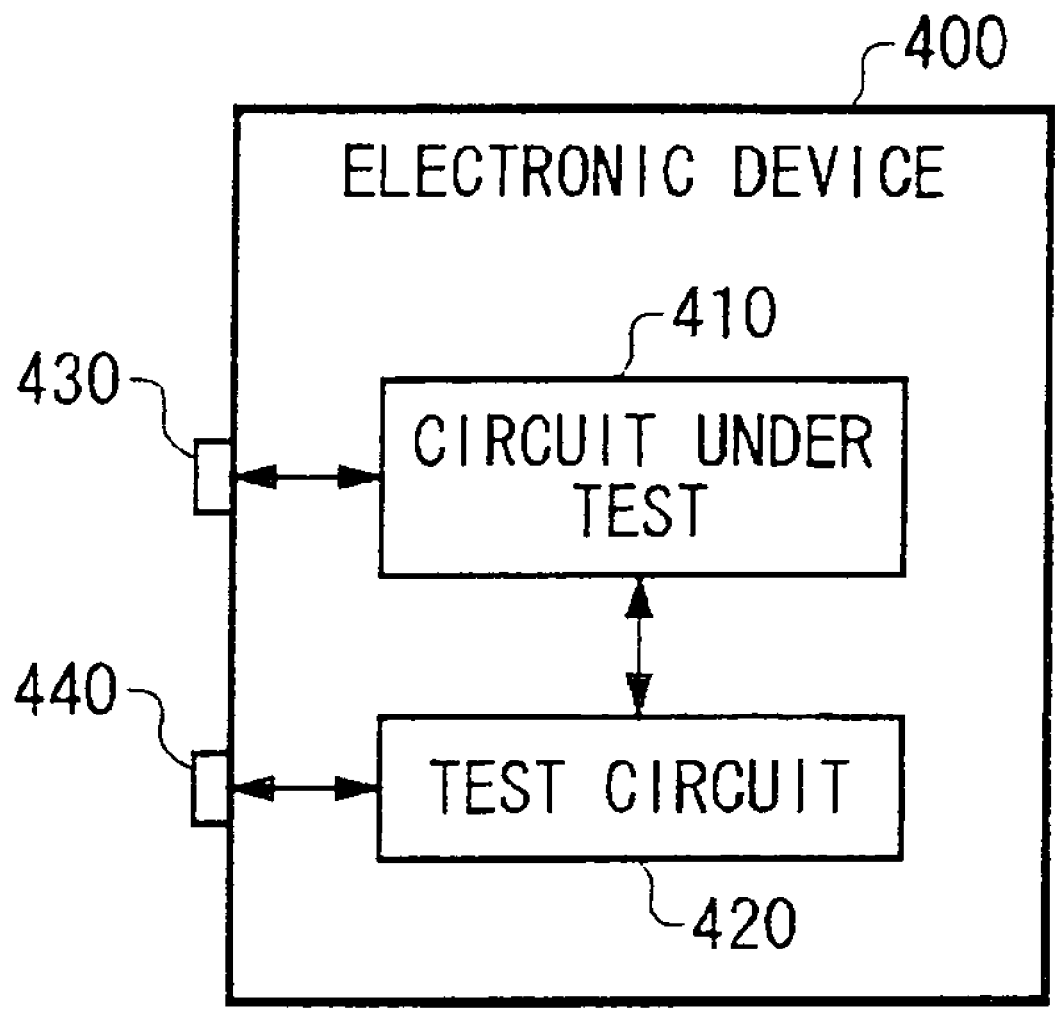
FIG. 10 shows an example of electronic device 400 according to the present invention.

FIG. 10 shows an example of an electronic device 400 according to an embodiment of the present invention. The electronic device 400 includes a circuit under test 410, a test circuit 420, an input/output pin 430 and a BIST pin 440. The circuit under test 410 may be a circuit that operates when the electronic device 400 actually operates. The circuit under test 410 operates in accordance to a signal provided from the input/output pin 430 when the electronic device actually operates.

For example, in a case that the electronic device 400 is a memory device, the circuit under test 410 may be a circuit including a memory cell of the electronic device 400. For example, the circuit under test 410 may be a memory cell and a control circuit that controls the memory cell. The control circuit may be a circuit that controls to write data to the memory cell and read data from the memory cell.

The test circuit 420 is provided on a semiconductor chip on which the circuit under test 410 is also provided and tests the circuit under test 410. The test circuit 420 may have the configuration the same as that of the test module 100 described with reference to FIG. 1-FIG. 9. In addition, the test circuit 420 may have a part of configuration of the test module 100. Moreover, the test circuit 420 may be a circuit that performs a part of function of the test module 100. For example, the test circuit 420 does not necessarily need the result memory 16. Then, the rate generating section 30 and the timing generating section 56 of the test circuit 420 may operate by a setting value of the fixed timing set.

Moreover, the test circuit 420 may test the circuit under test 410 when a signal indicating that a self-test of the circuit under test 410 is performed is provided from an external test apparatus through the BIST pin 440. It is preferred that the BIST pin 440 is not used when the electronic device 40 actually operates. Then, the test circuit 420 may output the test result of the circuit under test 410 from the BIST pin 440 to the external test apparatus.

The external test apparatus may operate as well as the site control device 130 described above with reference to FIG. 1. That is, the test control program, the test program data and the test pattern data and so forth may be provided to the test circuit 420 in order to operate the test circuit 420 as well as the test module 100 described above with reference to FIG. 1-FIG. 9.

While the invention has been described by way of the exemplary embodiments, it should be understood that those skilled in the art might make many changes and substitutions without departing from the spirit and scope of the invention. It is obvious from the definition of the appended claims that the embodiments with such modifications also belong to the scope of the invention.

As evidenced by the above description, the test apparatus can reduce the amount of data stored in the main memory 40 and improve the utilization ratio of the memory. Moreover, when the same test pattern is generated, the amount of data read from the main memory 40 can be reduced to improve the generation speed of the test pattern.

What is claimed is:

1. A test apparatus that tests a device under test, comprising:
    a main memory that stores pattern data including at least one pattern bit defining a test signal provided to each of a plurality of terminals of the device under test;
    a pattern cache memory that caches the pattern data read from the main memory;
    a pattern generation control section that reads pattern data from the main memory and writes the same to the pattern cache memory;
    a pattern generating section that causes the pattern cache memory to sequentially read the pattern data stored in each cache entry of the pattern cache memory and to output the same; and
    a channel circuit that generates a test signal corresponding to each of the plurality of terminals based on the pattern data outputted from the pattern generating section and provides the test signal to the device under test,
    the pattern generation control section including:
    a replicating section that at least one pattern bit as pattern bits corresponding to two or more terminals to generate pattern data including pattern bits for the plurality of terminals; and
    a writing section that writes the pattern data including the pattern bits for the plurality of terminals to the pattern cache memory,
    wherein the writing section writes the pattern data read from the main memory to the pattern cache memory in a first operation mode in which the pattern data including the pattern bits for the plurality of terminals is stored in the main memory, and writes the pattern data generated by the replicating section to the pattern cache memory in a second operation mode in which the pattern data including the number of pattern bits less than the plurality of terminals is stored in the main memory.

2. The test apparatus as set forth in claim 1, wherein the pattern generation control section further includes an allocating register that designates which of terminals to which each pattern bit included in the pattern data read from the main memory is allocated, and the replicating section generates pattern data obtained by allocating each pattern bit included in the pattern data read from the main memory to at least one terminal designated by the allocating register.

3. The test apparatus as set forth in claim 1, wherein the replicating section replicates each of two or more pattern bits corresponding to two or more terminals among the plurality of terminals as the pattern bits corresponding to each of the same number of terminals.

4. The test apparatus as set forth in claim 1, wherein the replicating section reads the pattern data including the pattern bit corresponding to the terminal of a first device under test from the main memory and replicates the pattern bit corresponding to the terminal of the first device under test as the pattern bit corresponding to a second device under test to generate pattern data including the pattern bits for the first device under test and the second device under test.

5. An electronic device comprising:
   a circuit under test that operates in accordance with a signal inputted to the device at the time at which the device is actually operated; and
   a test circuit that tests the circuit under test,
   the test circuit including:
      a main memory that stores pattern data including at least one pattern bit defining a test signal provided to each of a plurality of terminals of the circuit under test;
      a pattern cache memory that caches the pattern data read from the main memory;
      a pattern generation control section that reads pattern data from the main memory and writes the same to the pattern cache memory;
      a pattern generating section that causes the pattern cache memory to sequentially read the pattern data stored in each cache entry of the pattern cache memory and to output the same; and
      a channel circuit that generates a test signal corresponding to each of the plurality of terminals based on the pattern data outputted from the pattern generating section and provides the test signal to the circuit under test,
   the pattern generation control section including:
      a replicating section that replicates at least one pattern bit as pattern bits corresponding to two or more terminals to generate pattern data including pattern bits for the plurality of terminals; and
      a writing section that writes the pattern data including the pattern bits for the plurality of terminals to the pattern cache memory,
      wherein the writing section writes the pattern data read from the main memory to the pattern cache memory in a first operation mode in which the pattern data including the pattern bits for the plurality of terminals is stored in the main memory, and writes the pattern data generated by the replicating section to the pattern cache memory in a second operation mode in which the pattern data including the number of pattern bits less than the plurality of terminals is stored in the main memory.

* * * * *